(12) United States Patent
Hirota et al.

(10) Patent No.: US 10,808,085 B2
(45) Date of Patent: Oct. 20, 2020

(54) PHENOL NOVOLAK RESIN, CURABLE RESIN COMPOSITION, AND CURED PRODUCT THEREOF

(71) Applicant: DIC Corporation, Tokyo (JP)

(72) Inventors: Yousuke Hirota, Ichihara (JP); Shota Tanii, Kitaadachi-gun (JP)

(73) Assignee: DIC Corporation, Tokyo (JP)

( * ) Notice: Subject to any disclaimer, the term of this patent is extended or adjusted under 35 U.S.C. 154(b) by 50 days.

(21) Appl. No.: 16/312,588

(22) PCT Filed: Jun. 15, 2017

(86) PCT No.: PCT/JP2017/022074
§ 371 (c)(1),
(2) Date: Dec. 21, 2018

(87) PCT Pub. No.: WO2018/003513
PCT Pub. Date: Jan. 4, 2018

(65) Prior Publication Data
US 2019/0225758 A1 Jul. 25, 2019

(30) Foreign Application Priority Data
Jun. 29, 2016 (JP) .................. 2016-128864

(51) Int. Cl.
*C08J 5/04* (2006.01)
*C08G 59/62* (2006.01)
(Continued)

(52) U.S. Cl.
CPC .................. *C08J 5/04* (2013.01); *C08G 8/12* (2013.01); *C08G 59/62* (2013.01); *C08J 5/18* (2013.01);
(Continued)

(58) Field of Classification Search
CPC . C08J 5/04; C08J 5/18; C08J 2361/10; C08G 8/12; C08G 59/62
See application file for complete search history.

(56) References Cited

U.S. PATENT DOCUMENTS

| 3,928,288 A * | 12/1975 | Walker | C08G 59/08 525/504 |
| 5,151,496 A * | 9/1992 | Bertram | C08G 8/08 525/481 |

(Continued)

FOREIGN PATENT DOCUMENTS

| JP | 07-010967 A | 1/1995 |
| JP | 2002-302525 A | 10/2002 |

(Continued)

OTHER PUBLICATIONS

English language machine translation of JP2004238618, conducted on Espacenet on Apr. 11, 2020 (23 pages).*

(Continued)

*Primary Examiner* — Nicholas E Hill
(74) *Attorney, Agent, or Firm* — Locke Lord LLP

(57) ABSTRACT

A phenol novolak resin having an excellent balance between the mold shrinkage of a composition containing the phenol novolak resin during heat curing and the modulus of elasticity at high temperature. A phenol novolak resin that is an alkyl phenol novolak resin produced by bonding alkyl phenol (I), in which an alkyl group having a carbon number of 4 to 8 is included as a substituent on an aromatic ring, to each other with a methylene group interposed therebetween, wherein the ratio (a)/(b) of a value (a) of integration from 146 to 148 ppm to a value (b) of integration from 146 to 153 ppm based on the 13C-NMR measurement is within the range of 0.05 to 0.30, and the area ratio of alkyl phenol (I) based on GPC measurement is within the range of 0.01% to 3.0%, a curable resin composition using the same, and a cured product thereof.

20 Claims, 4 Drawing Sheets

(51) Int. Cl.
  *C08G 8/12* (2006.01)
  *C08L 61/06* (2006.01)
  *C09D 163/00* (2006.01)
  *H01L 23/29* (2006.01)
  *H01L 23/14* (2006.01)
  *H01L 23/31* (2006.01)
  *C08J 5/18* (2006.01)

(52) U.S. Cl.
  CPC ............ *C08L 61/06* (2013.01); *C09D 163/00* (2013.01); *H01L 23/145* (2013.01); *H01L 23/29* (2013.01); *H01L 23/31* (2013.01); *C08J 2361/10* (2013.01)

(56) References Cited

U.S. PATENT DOCUMENTS

2011/0144272 A1* 6/2011 Shirrell ................ C08G 59/027
    525/139
2012/0028050 A1* 2/2012 Shiga .................. C08G 59/621
    428/413

FOREIGN PATENT DOCUMENTS

| | | |
|---|---|---|
| JP | 2004-238618 A | 8/2004 |
| JP | 2010-235643 A | 10/2010 |
| JP | 2011-074220 A | 4/2011 |
| JP | 2016-089096 A | 5/2016 |
| WO | 2012/141174 A1 | 10/2012 |

OTHER PUBLICATIONS

T. E. Nowlin & W. H. Boyd, "Characterization of Novolac Resins Based on p-tert-Butylphenol by PMR Spectroscopy," 14 Journal of Polymer Science: Polymer Chemistry Edition 2341 (1976).*

Giovanni Casiraghi et al., "Synthesis of 4-tert-Butylphenol Novolac Resins and Related Open Chain Olligomeric Compounds," 184 Makromol. Chem. 1363 (1983).*

Ha Q. Pham & Maurice J. Marks, "Epoxy Resins," in 13 Ullmann's Encyclopedia of Industrial Chemistry 155 (published online 2005).*

International Search Report dated Sep. 12, 2017, issued for PCT/JP2017/022074.

* cited by examiner

[Fig. 1]
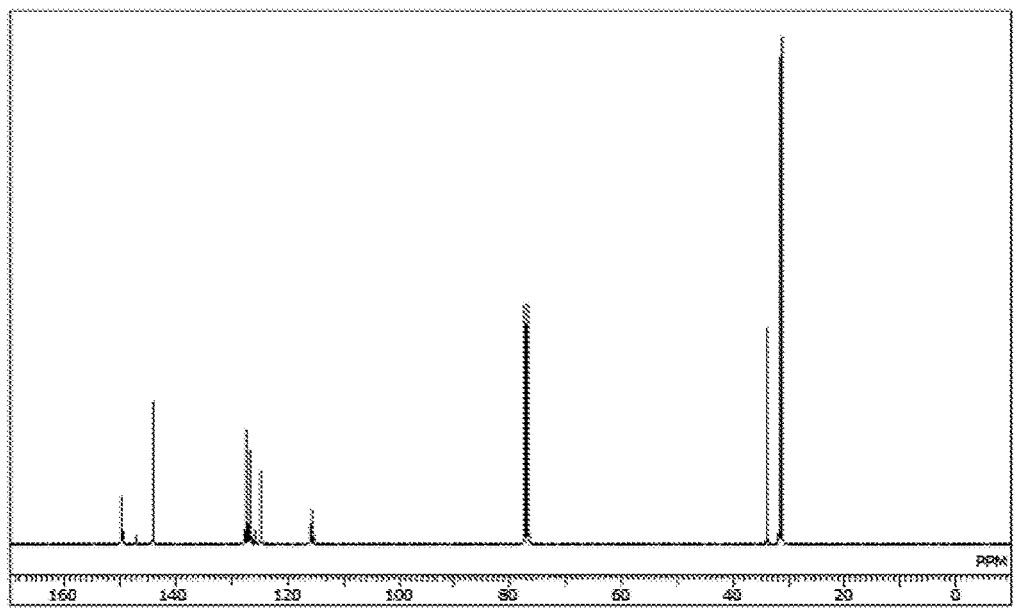
[Fig. 2]
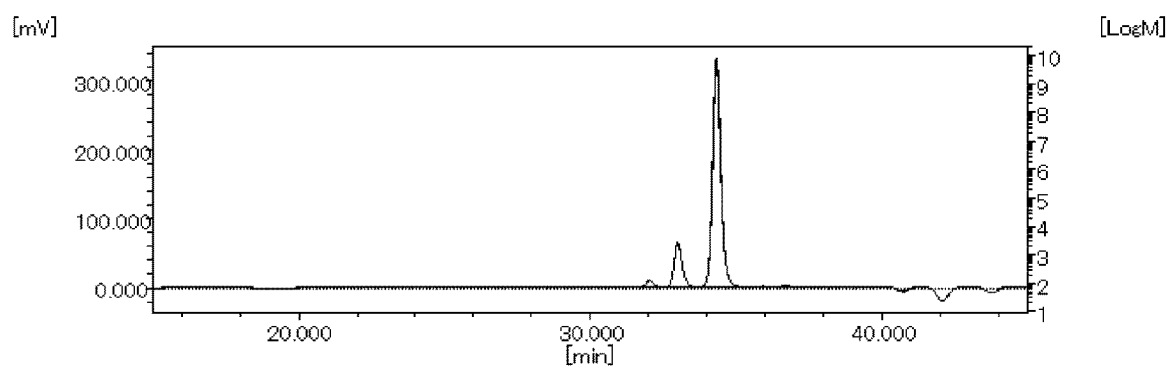
[Fig. 3]
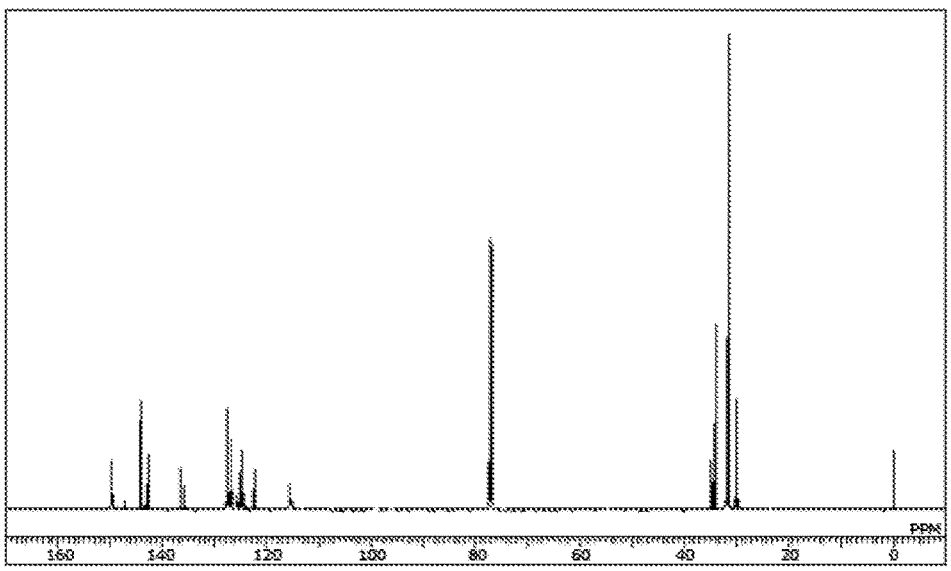

【Fig. 4】
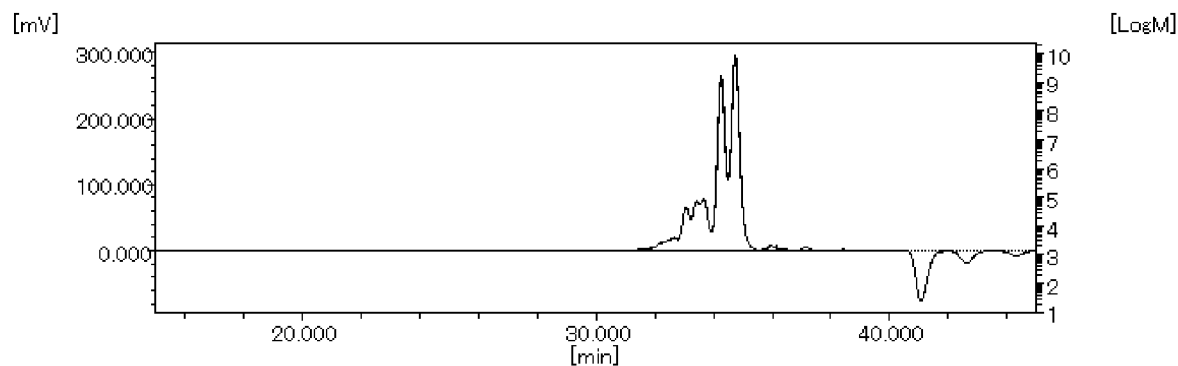
【Fig. 5】
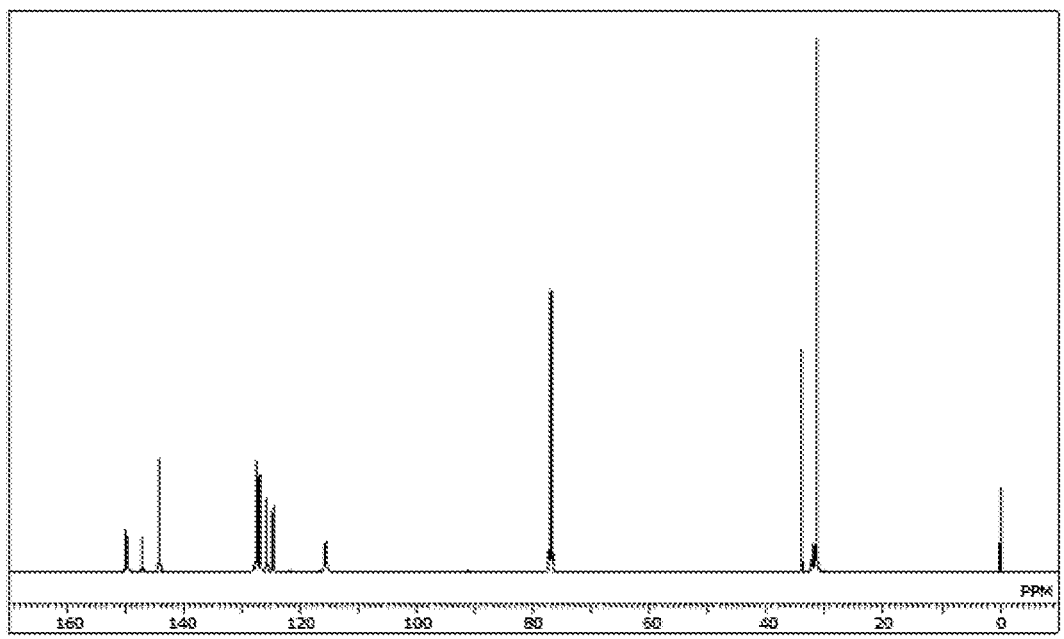
【Fig. 6】
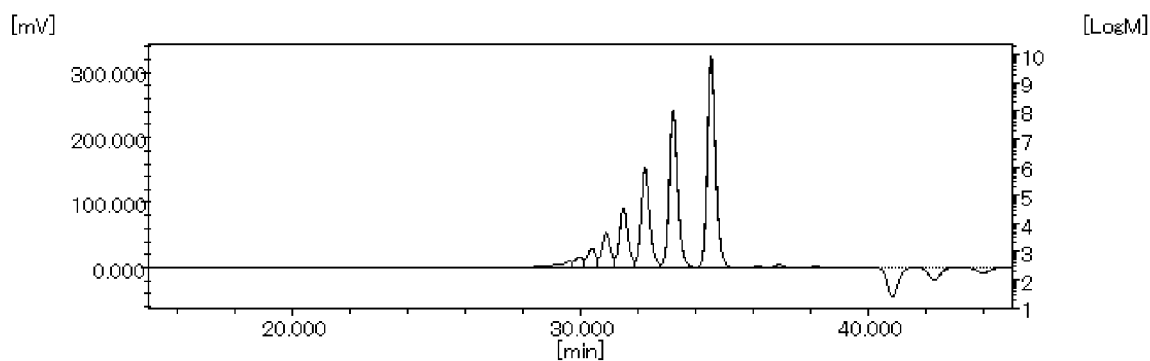

[Fig. 7]
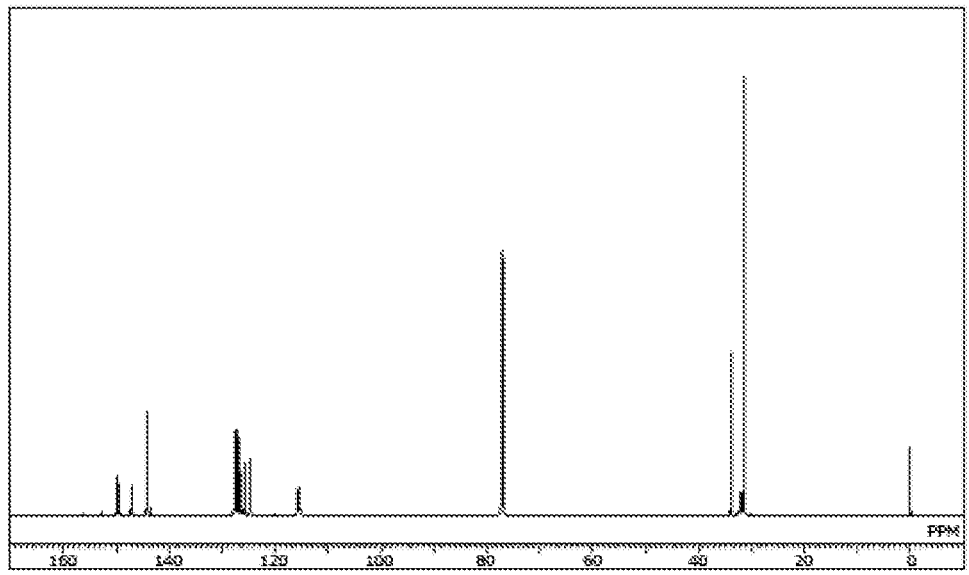
[Fig. 8]
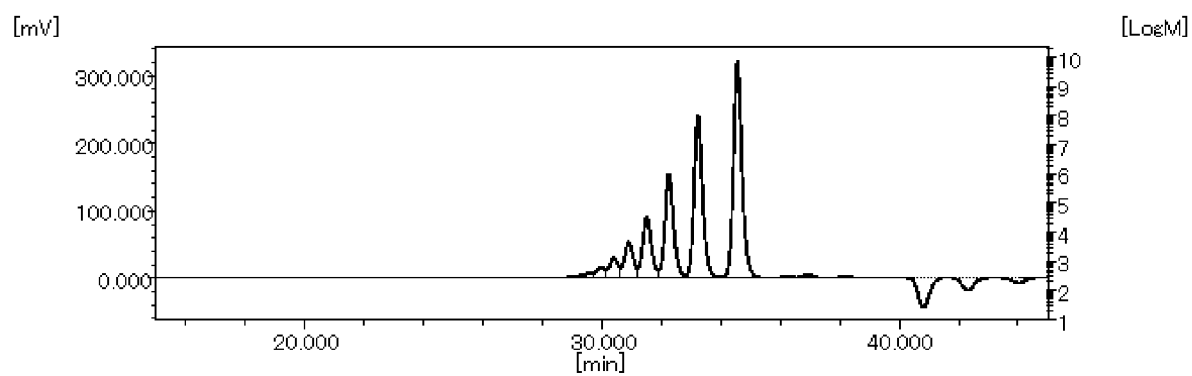
[Fig. 9]
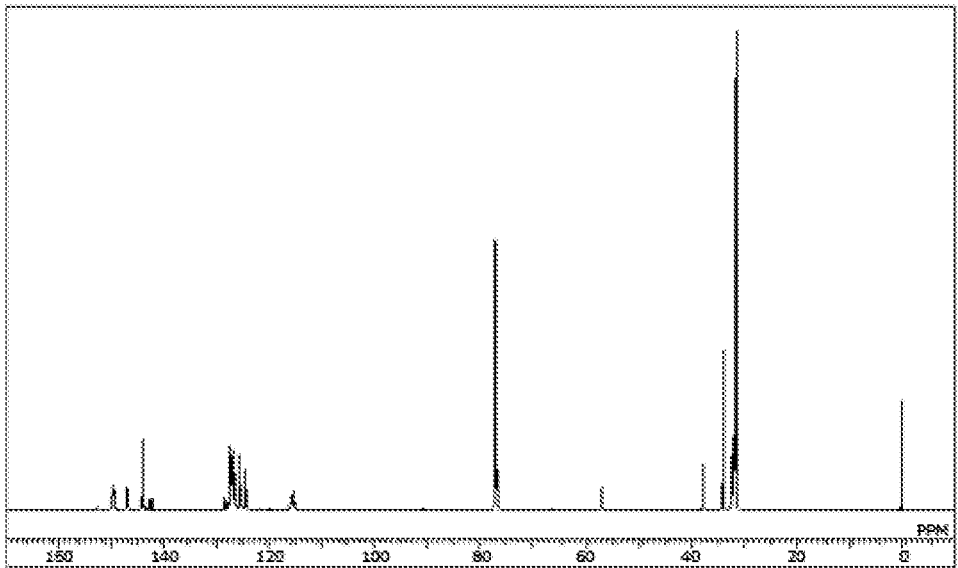

【Fig. 1 0】
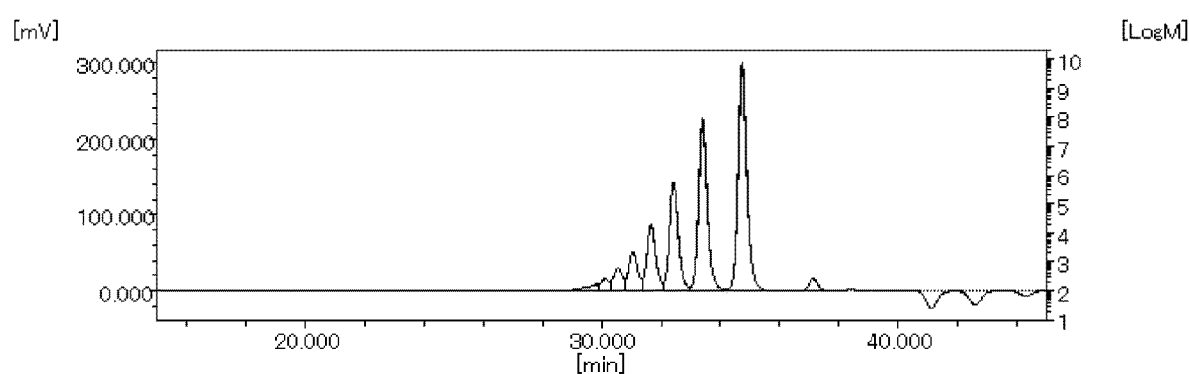

PHENOL NOVOLAK RESIN, CURABLE RESIN COMPOSITION, AND CURED PRODUCT THEREOF

TECHNICAL FIELD

The present invention relates to a phenol novolak resin that has an excellent balance between the fluidity, high shrinkage during heat curing, and low modulus of elasticity and that is suitable for use in a semiconductor sealing material and the like, a curable resin composition containing the phenol novolak resin, and a cured product thereof.

BACKGROUND ART

Phenol novolak resins are combined with, for example, a curing agent of an epoxy resin so as to be made into curable resin compositions and are used for adhesives, forming materials, paints, photoresist materials, developing materials, and the like. In addition, the curable resin compositions are widely used in the electric-electronic field, for example, semiconductor sealing materials and printed circuit board insulating materials, from the viewpoint of excellent heat resistance, moisture resistance, and the like of the resulting cured product.

In the electric-electronic field of these various uses, there are intense requirements for thickness reduction and weight reduction, and a wafer level packaging technology is one of mounting technologies to address these requirements. The wafer level packaging technology is a mounting technology in which a semiconductor package is produced by performing resin sealing, rewiring, and electrode formation in a wafer state and dividing the wafer into individual pieces by dicing. Sealing with a sealing resin is performed by one operation and, therefore, warping occurs due to shrinkage during curing of the resin and due to a difference in the amount of shrinkage resulting from the linear expansion coefficient of a chip and the linear expansion coefficient of the sealing resin. The warping significantly degrade the reliability of the package. Therefore, for the purpose of suppressing warping, the sealing resin is required to have lower viscosity, smaller shrinkage, and lower modulus of elasticity.

Regarding the phenol novolak resin suitable for use as an epoxy resin curing agent for electronic materials, in particular, in application to a laminate having excellent moisture resistance and solder resistance, for example, a resin that is a phenol novolak resin having 25% by mass or more of trifunctional compound and that has a substituent on an aromatic ring of at least one phenol constituting the resin is provided (refer to, for example, PTL 1). Alternatively, it is known that an epoxy resin containing a naphthylene ether skeleton is suitable for use as a semiconductor sealing agent (refer to, for example, PTL 2).

As described above, when the curable resin compositions prepared from phenols that have a substituent on an aromatic ring and that serve as raw materials are used, some extent of effect is obtained in the strength and the moisture resistance of the resulting cured products. However, the balance between the viscosity of a resin composition, mold shrinkage during heat curing, and the modulus of elasticity does not adequately satisfy the level required in recent years and a further improvement has been required.

CITATION LIST

Patent Literature

PTL 1: Japanese Unexamined Patent Application Publication No. 7-10967

PTL 2: Japanese Unexamined Patent Application Publication No. 2016-89096

SUMMARY OF INVENTION

Technical Problem

Accordingly, an issue to be addressed by the present invention is the provision of a phenol novolak resin that has an excellent balance between the mold shrinkage of a composition containing the phenol novolak resin during heat curing and the modulus of elasticity, a composition, and a cured product thereof.

Solution to Problem

To address the above-described issues, the present inventors performed intensive research. As a result, it was found that, regarding a novolak resin of an alkyl phenol in which an alkyl group having a carbon number of 4 to 8 was included as a substituent on an aromatic ring, an excellent balance between the mold shrinkage during heat curing and the modulus of elasticity was ensured by using a novolak resin that contained an alkyl phenol serving as a raw material and that had the ratio of a value (a) of integration from 146 to 148 ppm to a value (b) of integration from 146 to 153 ppm based on the $^{13}$C-NMR measurement falling within a specific range, and the present invention was realized.

That is, a phenol novolak resin that is an alkyl phenol novolak resin produced by bonding alkyl phenol (I), in which an alkyl group having a carbon number of 4 to 8 is included as a substituent on an aromatic ring, to each other with a methylene group interposed therebetween, wherein the ratio (a)/(b) of a value (a) of integration from 146 to 148 ppm to a value (b) of integration from 146 to 153 ppm based on the $^{13}$C-NMR measurement is within the range of 0.05 to 0.30, and the area ratio of alkyl phenol (I) based on GPC measurement is within the range of 0.01% to 3.0%, is provided, and a curable resin composition including the same and a cured product thereof are provided.

Advantageous Effects of Invention

The present invention can provide a phenol novolak resin that has an excellent balance between the mold shrinkage during heat curing of a resin composition and the modulus of elasticity and that is suitable for use in a semiconductor sealing material and the like, a curable resin composition, a cured product having the above-described performance, a semiconductor sealing material, a semiconductor device, a prepreg, a circuit board, a build-up film, a build-up substrate, a fiber-reinforced composite material, and a fiber-reinforced molded article.

BRIEF DESCRIPTION OF DRAWINGS

FIG. 1 is a $^{13}$C-NMR chart of phenol novolak resin (A-1) synthesized in synthesis example 1.

FIG. 2 is a GPC chart of phenol novolak resin (A-1) synthesized in synthesis example 1.

FIG. 3 is a $^{13}$C-NMR chart of phenol novolak resin (A-3) synthesized in synthesis example 3.

FIG. 4 is a GPC chart of phenol novolak resin (A-3) synthesized in synthesis example 3.

FIG. 5 is a $^{13}$C-NMR chart of phenol novolak resin (A'-1) synthesized in comparative synthesis example 1.

FIG. 6 is a GPC chart of phenol novolak resin (A'-1) synthesized in comparative synthesis example 1.

FIG. 7 is a $^{13}$C-NMR chart of phenol novolak resin (A'-2) synthesized in comparative synthesis example 2.

FIG. 8 is a GPC chart of phenol novolak resin (A'-2) synthesized in comparative synthesis example 2.

FIG. 9 is a $^{13}$C-NMR chart of phenol novolak resin (A'-3) synthesized in comparative synthesis example 3.

FIG. 10 is a GPC chart of phenol novolak resin (A'-3) synthesized in comparative synthesis example 3.

DESCRIPTION OF EMBODIMENTS

<Phenol Novolak Resin>

The present invention will be described below in detail.

A phenol novolak resin according to the present invention is a phenol novolak resin produced from alkyl phenol (I) in which an alkyl group having a carbon number of 4 to 8 is included as a substituent on an aromatic ring, wherein the ratio (a)/(b) of a value (a) of integration from 146 to 148 ppm to a value (b) of integration from 146 to 153 ppm based on the $^{13}$C-NMR measurement is within the range of 0.05 to 0.35 and the area ratio of alkyl phenol (I) based on GPC measurement is within the range of 0.01% to 3.0%.

Regarding the $^{13}$C-NMR measurement, peaks detected in each range of 146 to 148 ppm and 146 to 153 ppm are resulting from carbon atoms bonded to hydroxy groups in aromatic rings constituting the phenol novolak resin, peaks at 146 to 148 ppm are attributed to carbon atoms in aromatic rings present at other than ends of the molecule, and peaks at 146 to 153 ppm are attributed to all carbon atoms in aromatic rings bonding to hydroxy groups in the molecule.

In the present invention, it was found that, when a resin having a peak ratio (a)/(b) within a predetermined range, specifically within the range of 0.05 to 0.30, was used as one component of a curable resin composition, excellent balance between the mold shrinkage during heat curing and the modulus of elasticity was ensured because an alkyl group having a carbon number of 4 to 8 was included as a substituent on an aromatic ring. If the ratio (a)/(b) is less than 0.05, the cross-linking density of the cured product becomes insufficient. Consequently, the heat resistance becomes insufficient and the mold shrinkage increases. Meanwhile, if the ratio (a)/(b) is more than 0.30, the melt viscosity becomes unsuitable for use as a sealing material. In addition, the hydroxy group concentration inside the phenol novolak resin increases and bulky substituents serve as steric hindrances. Therefore, hydroxy groups that are not involved in a curing reaction tend to remain, the mold shrinkage during curing increases, and the heat resistance of the cured product is degraded and, therefore, there is no practical use.

In this regard, $^{13}$C-NMR in the present invention is performed by the following measuring method.

Apparatus: AL-400 produced by JEOL LTD.
Measurement mode: inverse-gated decoupling
Solvent: deuterated chloroform
Pulse angle: 30° pulse
Sample concentration: 30% by weight
Number of acquisitions: 4,000 times Further, the phenol novolak resin according to the present invention contains alkyl phenol (I) that is used as the raw material within the range of 0.01% to 3.0% in terms of area ratio based on the GPC measurement. When this range of alkyl phenol (I) is contained, the cross-linking density of the cured product falls within an appropriate range, and excellent balance between the heat resistance and the mold shrinkage is ensured.

Examples of the phenol novolak resin according to the present invention include resins denoted by general formula (1) described below.

[Chem. 1]

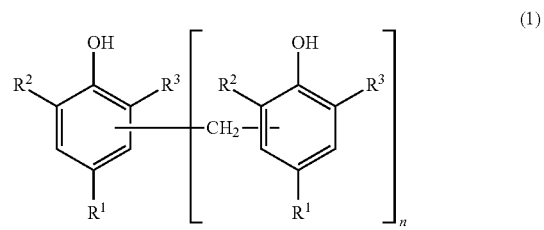

(1)

[in formula (1), each of $R^1$, $R^2$, and $R^3$ represents a hydrogen atom or an alkyl group having a carbon number of 4 to 8, at least one is an alkyl group having a carbon number of 4 to 8, and n represents an integer of 0 to 5]

That is, it is preferable that the substituent on the aromatic ring be located at an ortho position or a para position relative to the hydroxy group of the phenol because the curing reaction smoothly advances, because the raw materials are readily industrially available, and because more excellent balance between the mold shrinkage during heat curing and the modulus of elasticity is ensured. Further, the average value of the number of repetitions is more preferably within the range of 0.01 to 2.

In particular, it is preferable that the substituent on the aromatic ring be an alkyl group having a branch structure, for example, a t-butyl group or a t-octyl group, and particularly a t-butyl group is most preferable because the cross-linking density of the cured product falls within a more appropriate range when a curable resin composition is produced by combination with other resins as described later.

In addition, it is preferable that one or two of $R^1$, $R^2$, and $R^3$ in formula (1) be t-butyl groups because excellent balance between the heat resistance of the cured product, the mold shrinkage, the modulus of elasticity, and the melt viscosity of a resin is ensured, and it is still more preferable that $R^1$ be a t-butyl group and each of $R^2$ and $R^3$ be a hydrogen atom.

In this regard, n in general formula (1) according to the present invention can be determined by the GPC measurement under the following conditions.

<GPC Measurement Conditions>

Measurement apparatus: "HLC-8320 GPC" produced by Tosoh Corporation

Column: guard column "HXL-L" produced by Tosoh Corporation+"TSK-GEL G2000HXL" produced by Tosoh Corporation+"TSK-GEL G2000HXL" produced by Tosoh Corporation+"TSK-GEL G3000HXL" produced by Tosoh Corporation+"TSK-GEL G4000HXL" produced by Tosoh Corporation Detector: RI (differential refractometer)

Data processing: "GPC workstation EcoSEC-WorkStation" produced by Tosoh Corporation Measurement condition:
column temperature 40° C.
developing solvent tetrahydrofuran
flow rate 1.0 ml/min Standard: in conformity with the measurement manual of "GPC workstation EcoSEC-WorkStation" described above, monodisperse polystyrenes, as described below, having known molecular weights are used (Polystyrene Used)
"A-500" produced by Tosoh Corporation
"A-1000" produced by Tosoh Corporation "A-2500" produced by Tosoh Corporation
"A-5000" produced by Tosoh Corporation
"F-1" produced by Tosoh Corporation
"F-2" produced by Tosoh Corporation
"F-4" produced by Tosoh Corporation
"F-10" produced by Tosoh Corporation
"F-20" produced by Tosoh Corporation
"F-40" produced by Tosoh Corporation
"F-80" produced by Tosoh Corporation
"F-128" produced by Tosoh Corporation Sample: a tetrahydrofuran solution containing 1.0% by mass of resin solid content is filtrated by a microfilter (50 μl)

<Method for Manufacturing Phenol Novolak Resin>

As described above, the phenol novolak resin according to the present invention provides the specific $^{13}$C-NMR chart. The method for obtaining such a phenol novolak resin may be a method that uses the alkyl phenol (I), in which an alkyl group having a carbon number of 4 to 8 is included as a substituent on an aromatic ring, so as to perform a reaction with aldehydes in the presence of an acidic catalyst under the condition of 50° C. to 180° C.

Examples of the alkyl phenol (I), in which an alkyl group having a carbon number of 4 to 8 is included as a substituent on an aromatic ring, include t-butylphenol, di-t-butylphenol, and t-octylphenol, these may be used alone, or at least two types may be used in combination. Of these, a phenol including an alkyl group having a more bulky structure is preferable from the viewpoint of heat shrinkage of the curable resin composition using the resulting phenol novolak resin. Further, from the viewpoints of availability of the raw materials and the characteristics during curing of the resulting resin composition, p-t-butylphenol, o-t-butylphenol, 2,4-di-t-butylphenol, and p-t-octylphenol are used preferably, and p-t-butylphenol is used most preferably.

The above-described aldehydes have to undergo a condensation reaction with the alkyl phenol (I) so as to form a novolak resin, and examples of the aldehydes include formaldehyde, trioxane, acetaldehyde, propionaldehyde, tetraoxymethylene, polyoxymethylene, chloral, and hexamethylenetetramine. These may be used alone, or at least two types may be used in combination. In particular, it is preferable that formaldehyde be used because excellent reactivity is exhibited. Formaldehyde may be used as either formalin in the state of an aqueous solution or paraformaldehyde in the state of a solid.

Meanwhile, examples of the acidic catalyst include inorganic acids, for example, hydrochloric acid, sulfuric acid, and phosphoric acid, organic acids, for example, methanesulfonic acid, paratoluenesulfonic acid, and oxalic acid, and Lewis acids, for example, boron trifluoride, anhydrous aluminum chloride, and zinc chloride. These may be used alone, or at least two types may be used in combination.

Examples of the method for efficiently obtaining the phenol novolak resin according to the present invention include a method in which the aldehydes within the range of 0.05 to 0.40 mol are used relative to 1 mol of hydroxy group in the alkyl phenol (I), and a reaction is performed in the presence of the acidic catalyst under the temperature condition of 50° C. to 180° C.

The reaction between the alkyl phenol (I) and the aldehydes may be performed in a solvent, as the situation demands. Examples of the solvent used here include water; methanol, ethanol, propanol, ethyl lactate, ethylene glycol, 1,2-propanediol, 1,3-propanediol, 1,4-butanediol, 1,5-pentanediol, 1,6-hexanediol, 1,7-heptanediol, 1,8-octanediol, 1,9-nonanediol, trimethylene glycol, diethylene glycol, polyethylene glycol, glycerin, 2-ethoxyethanol, ethylene glycol monomethyl ether, ethylene glycol monoethyl ether, ethylene glycol monopropyl ether, ethylene glycol monobutyl ether, ethylene glycol monopentyl ether, ethylene glycol dimethyl ether, ethylene glycol ethylmethyl ether, ethylene glycol monophenyl ether, diethylene glycol ethylmethyl ether, propylene glycol monomethyl ether, 1,3-dioxane, 1,4-dioxane, tetrahydrofuran, ethylene glycol acetate, acetone, methyl ethyl ketone, methyl isobutyl ketone, cyclohexanone, N-methylpyrrolidone, dimethylformamide, and dimethylsulfoxide. These solvents may be used alone, or at least two types may be used as a mixed solvent.

After the reaction is finished, for example, a step of removing unreacted raw materials, the solvent, and the like by distillation and a step of performing refining by water washing, reprecipitation, or the like may be performed, as the situation demands.

<Curable Resin Composition>

When the phenol novolak resin according to the present invention is used in combination with other compounds having a functional group that reacts with a hydroxy group, a curable resin composition can be produced. The curable resin composition is suitable for use in various applications to electric-electronic members, for example, adhesives, paints, photoresists, printed circuit boards, and semiconductor sealing materials.

Examples of the other compounds having a functional group that reacts with a hydroxy group include a melamine compound, a guanamine compound, a glycoluril compound, an urea compound, a resol resin, an epoxy resin, an isocyanate compound, an azide compound, a compound including a double bond such as an alkenyl ether group, an acid anhydride, and an oxazoline compound that have at least one substituent selected from a group consisting of a methylol group, an alkoxymethyl group and an acyloxymethyl group.

Examples of the melamine compound include hexamethylolmelamine, hexamethoxymethylmelamine, compounds in which 1 to 6 methylol groups of hexamethylolmelamine are methoxymethylated, hexamethoxyethylmelamine, hexaacyloxymethylmelamine, and compounds in which 1 to 6 methylol groups of hexamethylolmelamine are acyloxymethylated.

Examples of the guanamine compound include tetramethylol guanamine, tetramethoxymethylguanamine, tetramethoxymethylbenzoguanamine, compounds in which 1 to 4 methylol groups of tetramethylol guanamine are methoxymethylated, tetramethoxyethylguanamine, tetraacyloxyguanamine, and compounds in which 1 to 4 methylol groups of tetramethylol guanamine are acyloxymethylated.

Examples of the glycoluril compound include 1,3,4,6-tetrakis(methoxymethyl)glycoluril, 1,3,4,6-tetrakis(butoxymethyl)glycoluril, and 1,3,4,6-tetrakis(hydroxymethyl)glycoluril.

Examples of the urea compound include 1,3-bis(hydroxymethyl)urea, 1,1,3,3-tetrakis(butoxymethyl)urea, and 1,1,3,3-tetrakis(methoxymethyl)urea.

Examples of the resol resin include a polymer obtained by reacting a phenolic-hydroxy-containing compound, for example, phenol, an alkyl phenol such as cresol or xylenol, phenyl phenol, resorcinol, biphenyl, a bisphenol such as bisphenol A or bisphenol F, naphthol, or dihydroxynaphthalene with an aldehyde compound in the presence of an alkaline catalyst.

Examples of the epoxy resin include a bisphenol A type epoxy resin, a bisphenol F type epoxy resin, a biphenyl type epoxy resin, a tetramethylbiphenyl type epoxy resin, a polyhydroxynaphthalene type epoxy resin, a phenol novolak type epoxy resin, a cresol novolak type epoxy resin, a triphenylmethane type epoxy resin, a tetraphenylethane type epoxy resin, a dicyclopentadiene-phenol addition reaction type epoxy resin, a phenol aralkyl type epoxy resin, a naphthol novolak type epoxy resin, diglycidyloxynaphthalene, a naphthol aralkyl type epoxy resin, a naphthol-phenol co-condensation novolak type epoxy resin, a naphthol-cresol co-condensation novolak type epoxy resin, an aromatic hydrocarbon formaldehyde resin modified phenol resin type epoxy resin, a biphenyl-modified novolak type epoxy resin, 1,1-bis(2,7-diglycidyloxy-1-naphthyl)alkane, a naphthylene ether type epoxy resin, a triphenylmethane type epoxy resin, a phosphorus-containing epoxy resin, a polyglycidyl ether that is a co-condensate of a phenolic-hydroxy-containing compound and an alkoxy-containing aromatic compound. Of these epoxy resins, it is preferable that a tetramethylbiphenol type epoxy resin, a biphenyl aralkyl type epoxy resin, a polyhydroxynaphthalene type epoxy resin, and a novolak type epoxy resin be used particularly because a cured product having excellent flame retardancy is obtained, and a dicyclopentadiene-phenol addition reaction type epoxy resin is preferable because a cured product having excellent dielectric characteristics is obtained.

Examples of the isocyanate compound include tolylene diisocyanate, diphenylmethane diisocyanate, hexamethylene diisocyanate, and cyclohexane diisocyanate.

Examples of the azide compound include 1,1'-biphenyl-4,4'-bisazide, 4,4'-methylidenebisazide, and 4,4'-oxybisazide.

Examples of the compound including a double bond such as an alkenyl ether group include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylolpropane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylolpropane trivinyl ether.

Examples of the acid anhydride include aromatic acid anhydrides, for example, phthalic anhydride, trimellitic anhydride, pyromellitic anhydride, 3,3',4,4'-benzophenonetetracarboxylic dianhydride, biphenyltetracarboxylic dianhydride, 4,4'-(isopropylidene)diphthalic anhydride, and 4,4'-(hexafluoroisopropylidene)diphthalic anhydride; and alicyclic carboxylic anhydrides, for example, tetrahydrophthalic anhydride, methyl tetrahydrophthalic anhydride, hexahydrophthalic anhydride, methyl hexahydrophthalic anhydride, endo-methylene tetrahydrophthalic anhydride, dodecenylsuccinic anhydride, and trialkyl tetrahydrophthalic anhydride.

Of these, an epoxy resin is particularly preferable because a curable composition having excellent curability is produced and the resulting cured product has excellent heat resistance.

Further, when the epoxy resin is used, an epoxy resin curing agent may be mixed.

Examples of the curing agent usable here include various known epoxy resin curing agents, for example, an amine-based compound, an amide-based compound, an acid-anhydride-based compound, and a phenolic compound.

Specific examples of the amine-based compound include diaminodiphenylmethane, diethylene triamine, triethylene tetramine, diaminodiphenyl sulfone, isophorone diamine, imidazole, a $BF_3$-amine complex, and a guanidine derivative. Examples of the amide-based compound include dicyandiamide and a polyamide resin synthesized from a linolenic acid dimer and ethylene diamine. Examples of the acid-anhydride-based compound include phthalic anhydride, trimellitic anhydride, pyromellitic anhydride, maleic anhydride, tetrahydrophthalic anhydride, methyl tetrahydrophthalic anhydride, methylnadic anhydride, hexahydrophthalic anhydride, and methyl hexahydrophthalic anhydride. Examples of the phenolic compound include polyvalent-phenolic-hydroxy-containing compounds, for example, a phenol novolak resin, a cresol novolak resin, an aromatic hydrocarbon formaldehyde resin modified phenol resin, a dicyclopentadiene-phenol-addition type resin, a phenol aralkyl resin (Xylok resin), a naphthol aralkyl resin, a triphenylolmethane resin, a tetraphenylolethane resin, a naphthol novolak resin, a naphthol-phenol co-condensation novolak resin, a naphthol-cresol co-condensation novolak resin, a biphenyl-modified phenol resin (polyvalent-phenolic-hydroxy-containing compound in which phenol cores are connected by a bismethylene group), a biphenyl-modified phenol resin (polyvalent naphthol compound in which phenol cores are connected by a bismethylene group), an aminotriazine-modified phenol resin (polyvalent-phenolic-hydroxy-containing compound in which phenol cores are connected by melamine, benzoguanamine, or the like), and an alkoxy-containing aromatic-ring-modified novolak resin (polyvalent-phenolic-hydroxy-containing compound in which phenol cores and alkoxy-containing aromatic rings are connected by formaldehyde).

Meanwhile, the curable resin composition according to the present invention may also include other thermosetting resins.

Examples of the other thermosetting resins include a cyanate ester resin, a resin having a benzoxazine structure, a maleimide compound, an active ester resin, a vinylbenzyl compound, an acrylic compound, and a copolymer of styrene and maleic anhydride. When the above-described other thermosetting resins are also used, there is no particular limitation regarding the amount of use as long as the effects of the present invention are not impaired, and the range of 1 to 50 parts by mass in 100 parts by mass of the curable resin composition is preferable.

Examples of the cyanate ester resin include a bisphenol A type cyanate ester resin, a bisphenol F type cyanate ester resin, a bisphenol E type cyanate ester resin, a bisphenol S type cyanate ester resin, a bisphenol sulfide type cyanate ester resin, a phenylene ether type cyanate ester resin, a naphthylene ether type cyanate ester resin, a biphenyl type cyanate ester resin, a tetramethylbiphenyl type cyanate ester resin, a polyhydroxynaphthalene type cyanate ester resin, a phenol novolak type cyanate ester resin, a cresol novolak type cyanate ester resin, a triphenylmethane type cyanate ester resin, a tetraphenylethane type cyanate ester resin, a dicyclopentadiene-phenol addition reaction type cyanate ester resin, a phenol aralkyl type cyanate ester resin, a naphthol novolak type cyanate ester resin, a naphthol aralkyl type cyanate ester resin, a naphthol-phenol co-condensation novolak type cyanate ester resin, a naphthol-cresol co-condensation novolak type cyanate ester resin, an aromatic hydrocarbon formaldehyde resin modified phenol resin type cyanate ester resin, a biphenyl-modified novolak type cyanate ester resin, and an anthracene type cyanate ester resin. These may be used alone, or at least two types may be used in combination.

Of these cyanate ester resins, in particular, a bisphenol A type cyanate ester resin, a bisphenol F type cyanate ester resin, a bisphenol E type cyanate ester resin, a polyhydroxynaphthalene type cyanate ester resin, a naphthylene ether type cyanate ester resin, and a novolak type cyanate ester resin are preferably used because a cured product having excellent heat resistance is obtained. Meanwhile, dicyclopentadiene-phenol addition reaction type cyanate ester resin is preferable because a cured product having excellent dielectric characteristics is obtained.

There is no particular limitation regarding the resin having a benzoxazine structure, and examples include a reaction product of bisphenol F, formalin, and aniline (F-a type benzoxazine resin) and a reaction product of diaminodiphenylmethane, formalin, and phenol (P-d type benzoxazine resin), a reaction product of bisphenol A, formalin, and aniline, a reaction product of dihydroxydiphenyl ether, formalin, and aniline, a reaction product of diaminodiphenyl ether, formalin, and phenol, a reaction product of dicyclopentadiene-phenol addition reaction type resin, formalin, and aniline, a reaction product of phenolphthalein, formalin, and aniline, and a reaction product of diphenyl sulfide, formalin, and aniline. These may be used alone, or at least two types may be used in combination.

Examples of the maleimide compound include various compounds denoted by any one of structural formulae (i) to (iii) described below.

[Chem. 2]

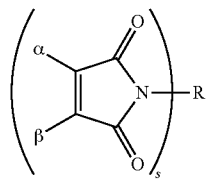

(i)

(In the formula, R represents an m-valent organic group, each of α and β represents any one of a hydrogen atom, a halogen atom, an alkyl group, and an aryl group, and s represents an integer of 1 or more.)

[Chem. 3]

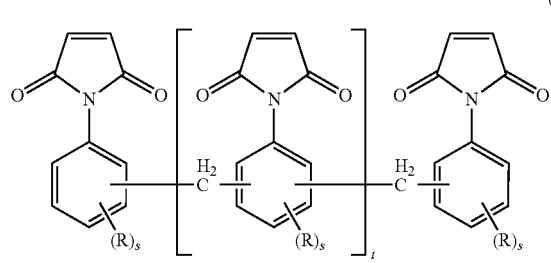

(ii)

(In the formula, R represents any one of a hydrogen atom, an alkyl group, an aryl group, an aralkyl group, a halogen atom, a hydroxy group, and an alkoxy group, s represents an integer of 1 to 3, and t represents an average of the number of repetitions of the repetition unit and is 0 to 10.)

[Chem. 4]

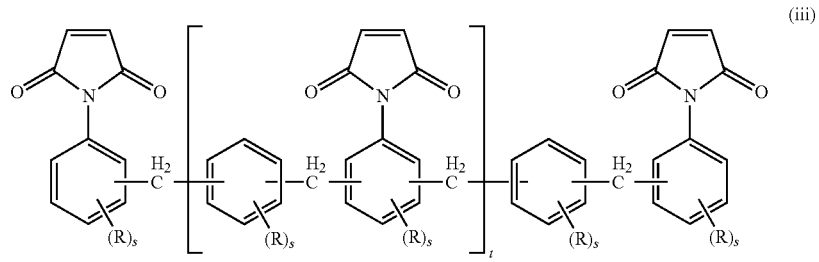

(iii)

(In the formula, R represents any one of a hydrogen atom, an alkyl group, an aryl group, an aralkyl group, a halogen atom, a hydroxy group, and an alkoxy group, s represents an integer of 1 to 3, and t represents an average of the number of repetitions of the repetition unit and is 0 to 10.) These may be used alone, or at least two types may be used in combination.

There is no particular limitation regarding the active ester resin, and in general, a compound including at least two ester groups having high reaction activity in the molecule, for example, phenol esters, thiophenol esters, N-hydroxyamine esters, and esters of heterocyclic hydroxy compounds, is preferably used. The active ester resin is preferably obtained by a condensation reaction of a carboxylic acid compound and/or a thiocarboxylic acid compound and a hydroxy compound and/or a thiol compound. In particular, from the viewpoint of an improvement of heat resistance, an active ester resin obtained from a carboxylic acid compound or a halide thereof and a hydroxy compound is preferable, and an active ester resin obtained from a carboxylic acid compound or a halide thereof and a phenol compound and/or naphthol compound is more preferable. Examples of the carboxylic acid compound include benzoic acid, acetic acid, succinic acid, maleic acid, itaconic acid, phthalic acid, isophthalic acid, terephthalic acid, and pyromellitic acid and halides thereof. Examples of the phenol compound or naphthol compound include hydroquinone, resorcin, bisphenol A, bisphenol F, bisphenol S, dihydroxydiphenyl ether, phenolphthalein, methylated bisphenol A, methylated bisphenol F, methylated bisphenol S, phenol, o-cresol, m-cresol, p-cresol, catechole, α-naphthol, β-naphthol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, phloroglucin, benzenetriol, and dicyclopentadiene-phenol addition type resin.

Regarding the active ester resin, specifically, an active ester resin having a dicyclopentadiene-phenol addition structure, an active ester resin having a naphthalene structure, an active ester resin that is acetylated phenol novolak, an active ester resin that is benzoylated phenol novolak, and the like are preferable. Of these, an active ester resin having a dicyclopentadiene-phenol addition structure and an active ester resin having a naphthalene structure are more preferable because an improvement of peal strength is facilitated. More specific examples of the active ester resin having a dicyclopentadiene-phenol addition structure include compounds denoted by general formula (iv) described below.

[Chem. 5]

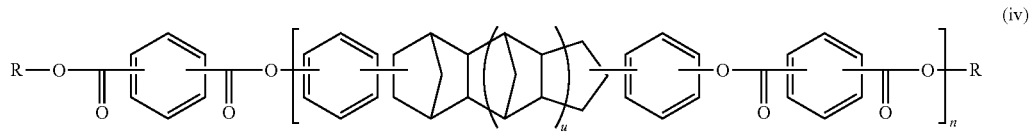

In formula (iv), R represents a phenyl group or a naphthyl group, u represents 0 or 1, and n represents an average of the number of repetitions of the repetition unit and is 0.05 to 2.5. In this regard, from the viewpoints of a reduction in dielectric loss tangent of a cured product of the resin composition and an improvement of heat resistance, R is preferably a naphthyl group, u is preferably 0, and n is preferably 0.25 to 1.5.

In addition, various novolak resins other than the phenol novolak resin according to the present invention, an addition polymerization resin from an alicyclic diene compound, for example, dicyclopentadiene and a phenol compound, a modified novolak resin from a phenolic-hydroxy-containing aromatic compound and an alkoxy-containing aromatic compound, a phenol aralkyl resin (Xylok resin), a naphthol aralkyl resin, a trimethylolmethane resin, a tetraphenylolethane resin, a biphenyl-modified phenol resin, a biphenyl-modified naphthol resin, an aminotriazine-modified phenol resin, and various vinyl polymers may be used in combination.

More specific examples of the various novolak resins include polymers obtained by reacting phenolic-hydroxy-containing compounds, for example, phenol, phenylphenol, resorcinol, biphenyl, bisphenol such as bisphenol A and bisphenol F, naphthol, and dihydroxynaphthalene, with an aldehyde compound under the condition of an acid catalyst.

Examples of the various vinyl polymers include a monopolymer of a vinyl compound, for example, a polyhydroxystyrene, a polystyrene, a polyvinyl naphthalene, a polyvinyl anthracene, a polyvinyl carbazole, a polyindene, a polyacenaphthylene, a polynorbornene, a polycyclodecene, a polytetracyclododecene, a polynortricyclene, and poly(meth)acrylate, or copolymers of these.

When the other resins are used, the mixing ratio of the other resins to the phenol novolak resin according to the present invention may be appropriately set in accordance with the use, and the proportion of the other resins is preferably 0.5 to 100 parts by mass relative to 100 parts by mass of the phenol novolak resin according to the present invention because an effect of ensuring a balance between the mold shrinkage during heat curing and the modulus of elasticity at high temperature, the effect being exerted by the present invention, is more apparently realized.

The curable resin composition according to the present invention may also include a curing accelerator. Examples of the curing accelerator include tertiary amine compounds, for example, imidazole and dimethylamino pyridine; phosphorus-based compounds, for example, triphenylphosphine; boron trifluoride and a boron trifluoride amine complex such as a boron trifluoride monoethylamine complex; organic acid compounds, for example, thiodipropionic acid; benzoxazine compounds, for example, thiodiphenol benzoxazine and sulfonyl benzoxazine; and sulfonyl compounds. These may be used alone, or at least two types may be used in combination. The amount of the catalyst added is preferably within the range of 0.001 to 15 parts by mass in 100 parts by mass of the curable resin composition.

Meanwhile, when the curable resin composition according to the present invention is used in an application in which high flame retardancy is required, a non-halogen-based flame retardant containing substantially no halogen atom may be mixed.

Examples of the non-halogen-based flame retardant include a phosphorus-based flame retardant, a nitrogen-based flame retardant, a silicone-based flame retardant, an inorganic flame retardant, and an organometallic-salt-based flame retardant. There is no particular limitation regarding use of these. These may be used alone, a plurality of flame retardants of the same type may be used, or flame retardants of different types may be used in combination.

Regarding the phosphorus-based flame retardant, either the inorganic base or the organic base may be used. Examples of the inorganic compound include red phosphorus, ammonium phosphates, for example, monoammonium phosphate, diammonium phosphate, triammonium phosphate, and polyammonium phosphate, and inorganic nitrogen-containing phosphorus compounds, for example, phosphoric amide.

In this regard, the red phosphorus is subjected to surface treatment for the purpose of preventing hydrolysis and the like. Examples of the surface treatment method include (i) a method in which covering treatment is performed by using an inorganic compound, for example, magnesium hydroxide, aluminum hydroxide, zinc hydroxide, titanium hydroxide, bismuth oxide, bismuth hydroxide, or bismuth nitrate, or a mixture of these, (ii) a method in which covering treatment is performed by using a mixture of an inorganic compound, for example, magnesium hydroxide, aluminum hydroxide, zinc hydroxide, or titanium hydroxide, and a thermosetting resin, for example, a phenol resin, and (iii) a method in which covering treatment is doubly performed by using a thermosetting resin, for example, a phenol resin, on a coating of an inorganic compound, for example, magnesium hydroxide, aluminum hydroxide, zinc hydroxide, or titanium hydroxide.

Examples of the organophosphorus-based compound include general-purpose organophosphorus-based compounds, for example, a phosphoric acid ester compound, a phosphonic acid compound, a phosphinic acid compound, a phosphine oxide compound, a phosphorane compound, and an organic nitrogen-containing phosphorus compound and, in addition, cyclic organophosphorus compounds, for example, 9,10-dihydro-9-oxa-10-phosphaphenanthrene-10-oxide, 10-(2,5-dihydroxyphenyl)-10H-9-oxa-10-phosphaphenanthrene-10-oxide, and 10-(2,7-dihydroxynaphthyl)-10H-9-oxa-10-phosphaphenanthrene-10-oxide, and derivatives produced by reacting the cyclic organophosphorus compound with a compound, for example, an epoxy resin or phenol resin.

The amount of the phosphorus-based flame retardant mixed is appropriately selected in accordance with the type of the phosphorus-based flame retardant, other components of the resin composition, and the degree of predetermined flame retardancy. For example, when red phosphorus is used as the non-halogen-based flame retardant, the amount of mixing is preferably within the range of 0.1 parts by mass to 2.0 parts by mass in 100 parts by mass of the resin composition in which all the non-halogen-based flame retardant and others, for example, fillers and additives, are mixed. Likewise, when the organophosphorus compound is used, the amount of mixing is preferably within the range of 0.1 parts by mass to 10.0 parts by mass, and the amount of mixing is more preferably within the range of 0.5 parts by mass to 6.0 parts by mass.

Meanwhile, when the phosphorus-based flame retardant is used, hydrotalcite, magnesium hydroxide, a boron compound, zirconium oxide, black die, calcium carbonate, zeolite, zinc molybdate, activated carbon, and the like may be used in combination with the phosphorus-based flame retardant.

Examples of the nitrogen-based flame retardant include a triazine compound, a cyanuric acid compound, an isocyanuric acid compound, and phenothiazine, and a triazine compound, a cyanuric acid compound, and an isocyanuric acid compound are preferable.

Examples of the triazine compound include melamine, acetoguanamine, benzoguanamine, mellon, melam, succinoguanamine, ethylene dimelamine, melamine polyphosphate, and triguanamine and, in addition, examples include (1) aminotriazine sulfate compounds, for example, guanylmelamine sulfate, melem sulfate, and melam sulfate, (2) co-condensates of phenols, for example, phenol, cresol, xylenol, butylphenol, and nonylphenol, melamines, for example, melamine, benzoguanamine, acetoguanamine, and formguanamine, and formaldehyde, (3) mixtures of the co-condensates described in (2) and phenol resins, for example, phenol-formaldehyde condensates, and (4) compounds produced by further modifying those described in (2) or (3) with tung oil, isomerized linseed oil, or the like.

Examples of the cyanuric acid compound include cyanuric acid and melamine cyanurate.

The amount of the nitrogen-based flame retardant mixed is appropriately selected in accordance with the type of the nitrogen-based flame retardant, other components of the resin composition, and the degree of predetermined flame retardancy. For example, the amount of mixing is preferably within the range of 0.05 to 10 parts by mass in 100 parts by mass of the resin composition in which all the non-halogen-based flame retardant and others, for example, fillers and additives, are mixed, and the amount of mixing is more preferably within the range of 0.1 parts by mass to 5 parts by mass.

Meanwhile, when the nitrogen-based flame retardant is used, a metal hydroxide, a molybdenum compound, or the like may be used in combination.

There is no particular limitation regarding the compound used as the silicone-based flame retardant as long as the compound is an organic compound containing silicon atoms. Examples of the silicone-based flame retardant include a silicone oil, a silicone rubber, and a silicone resin. The amount of the silicone-based flame retardant mixed is appropriately selected in accordance with the type of the silicone-based flame retardant, other components of the resin composition, and the degree of predetermined flame retardancy. For example, the amount of mixing is preferably within the range of 0.05 to 20 parts by mass in 100 parts by mass of the resin composition in which all the non-halogen-based flame retardant and others, for example, fillers and additives, are mixed. Meanwhile, when the silicone-based flame retardant is used, a molybdenum compound, alumina, or the like may be used in combination.

Examples of the inorganic flame retardant include a metal hydroxide, a metal oxide, a metal carbonate compound, a metal powder, a boron compound, and low-melting-temperature glass.

Examples of the metal hydroxide include aluminum hydroxide, magnesium hydroxide, dolomite, hydrotalcite, calcium hydroxide, barium hydroxide, and zirconium hydroxide.

Examples of the metal oxide include zinc molybdate, molybdenum trioxide, zinc stannate, aluminum oxide, iron oxide, titanium oxide, manganese oxide, zirconium oxide, zinc oxide, molybdenum oxide, cobalt oxide, bismuth oxide, chromium oxide, nickel oxide, copper oxide, and tungsten oxide.

Examples of the metal carbonate compound include zinc carbonate, magnesium carbonate, calcium carbonate, barium carbonate, basic magnesium carbonate, aluminum carbonate, iron carbonate, cobalt carbonate, and titanium carbonate.

Examples of the metal powder include aluminum, iron, titanium, manganese, zinc, molybdenum, cobalt, bismuth, chromium, nickel, copper, tungsten, and tin.

Examples of the boron compound include zinc borate, zinc metaborate, barium metaborate, boric acid, and borax.

Examples of the low-melting-temperature glass include CEEPREE (Bokusui Brown Co., Ltd.), hydrated glass $SiO_2$—$MgO$—$H_2O$, and vitreous compounds based on, for example, $PbO$—$B_2O_3$, $ZnO$—$P_2O_5$—$MgO$, $P_2O_5$—$B_2O_3$—$PbO$—$MgO$, $P$—$Sn$—$O$—$F$, $PbO$—$V_2O_5$—$TeO_2$, $Al_2O_3H_2O$, and lead borosilicate.

The amount of the inorganic flame retardant mixed is appropriately selected in accordance with the type of the inorganic flame retardant, other components of the resin composition, and the degree of predetermined flame retardancy. For example, the amount of mixing is preferably within the range of 0.05 parts by mass to 20 parts by mass in 100 parts by mass of the resin composition in which all the non-halogen-based flame retardant and others, for example, fillers and additives, are mixed, and the amount of mixing is more preferably within the range of 0.5 parts by mass to 15 parts by mass.

Examples of the organometallic-salt-based flame retardant include ferrocene, an acetylacetonate metal complex, an organometallic carbonyl compound, an organic cobalt salt compound, an organic sulfonic acid metal salt, and a compound in which a metal atom and an aromatic compound or a heterocyclic compound are ion-bonded or coordinate-bonded to each other.

The amount of the organometallic-salt-based flame retardant mixed is appropriately selected in accordance with the type of the organometallic-salt-based flame retardant, other components of the resin composition, and the degree of predetermined flame retardancy. For example, the amount of mixing is preferably within the range of 0.005 parts by mass to 10 parts by mass in 100 parts by mass of the resin composition in which all the non-halogen-based flame retardant and others, for example, fillers and additives, are mixed.

The curable resin composition according to the present invention may include an inorganic filler, as the situation demands. Examples of the inorganic filler include fused silica, crystalline silica, alumina, silicon nitride, and aluminum hydroxide. When the amount of the inorganic filler mixed is particularly increased, it is preferable that a fused silica be used. The fused silica that is either crushed or spherical may be used, and for the purpose of increasing the amount of the fused silica mixed and suppressing an increase in melt viscosity of a molding material, it is preferable that a spherical fused silica be mainly used. Further, to increase the amount of the spherical silica mixed, it is preferable that the particle size distribution of the spherical silica be appropriately adjusted. The filling factor is preferably high in consideration of the flame retardancy and is particularly preferably 20% by mass or more relative to the total mass of the epoxy resin composition. Meanwhile, in the use for application to a conductive paste or the like, a conductive filler, for example, a silver powder or a copper powder, may be used.

The curable resin composition according to the present invention may further include various additives, for example, a silane coupling agent, a mold release agent, a pigment, and an emulsifier, as the situation demands.

<Use of Curable Resin Composition>

The curable resin composition according to the present invention may be applied to a semiconductor sealing material, a semiconductor device, a prepreg, a printed circuit board, a build-up substrate, a build-up film, a fiber-reinforced composite material, a fiber-reinforced molded article, a conductive paste, and the like.

1. Semiconductor Sealing Material

A method for obtaining a semiconductor sealing material from the curable resin composition according to the present invention may be a method in which the curable resin composition and additives, for example, an inorganic filler, are sufficiently melt-mixed so as to be homogenized by using an extruder, a kneader, a roll, or the like, as the situation demands. In this regard, fused silica is usually used as the inorganic filler. In the case of use as a high-thermal-conductivity semiconductor sealing material for a power transistor or power IC, crystalline silica having higher thermal conductivity than the fused silica, alumina, silicon nitride, or the like may be used at a high filling rate or fused silica, crystalline silica, alumina, silicon nitride, or the like may be used. The filling factor of the inorganic filler is preferably within the range of 30 parts by mass to 95 parts by mass relative to 100 parts by mass of the curable resin composition. In particular, for the purpose of improving the flame retardancy, the moisture resistance, and the solder crack resistance and decreasing a linear expansion coefficient, 70 parts by mass or more is preferable, and 80 parts by mass or more is further preferable.

2. Semiconductor Device

A method for obtaining a semiconductor device from the curable resin composition according to the present invention may be a method in which the semiconductor sealing material is cast or molded by using a transfer molding machine, an injection molding machine, or the like and is further heated at 50° C. to 200° C. for 2 to 10 hours.

3. Prepreg

A method for obtaining a prepreg from the curable resin composition according to the present invention may be a method in which the prepreg is obtained by impregnating a reinforcing base material (paper, glass cloth, glass nonwoven fabric, aramid paper, aramid cloth, glass mat, glass roving cloth, or the like) with the curable resin composition made into varnish by being mixed with an organic solvent and, thereafter, performing heating at a heating temperature in accordance with the type of the solvent used, preferably at 50° C. to 170° C. There is no particular limitation regarding the mass ratios of the resin composition and the reinforcing base material used at this time, and it is usually preferable to adjust such that the resin content in the prepreg falls into 20% by mass to 60% by mass.

Examples of the organic solvent used here include methyl ethyl ketone, acetone, dimethylformamide, methyl isobutyl ketone, methoxypropanol, cyclohexanone, methylcellosolve, ethyl diglycol acetate, and propylene glycol monomethyl ether acetate. Selection and the optimum amount of use may be appropriately determined in accordance with the use. For example, when a printed circuit board is further produced from the prepreg, as described below, a polar solvent such as methyl ethyl ketone or dimethylformamide having a boiling temperature of 160° C. or lower is preferably used, and the polar solvent is used at such a proportion that a non-volatile content becomes 40% by mass to 80% by mass.

4. Printed Circuit Board

A method for obtaining a printed circuit board from the curable resin composition according to the present invention may be a method in which the prepregs are stacked by a common process, copper foil is appropriately stacked, and thermocompression bonding is performed under pressure of 1 to 10 MPa at 170° C. to 300° C. for 10 minutes to 3 hours.

5. Build-Up Substrate

A method for obtaining a build-up substrate from the curable resin composition according to the present invention may be a method through steps 1 to 3. In step 1, initially a circuit board provided with circuits is coated with the curable resin composition, into which rubber, filler, and the like are appropriately mixed, by using a spray coating method, a curtain coating method, or the like and, thereafter, curing is performed. In step 2, as the situation demands, predetermined through hole portions and the like are bored in the circuit board coated with the curable resin composition, treatment with a roughening agent is performed, the surface is washed with hot water so as to form unevenness on the substrate, and plating treatment with a metal, for example, copper, is performed. In step 3, as the situation demands, the operations of steps 1 and 2 are sequentially repeated so as to form a build-up substrate by alternately building up resin insulating layers and conductive layers provided with predetermined circuit patterns. In this regard, in the above-described step, boring of the through hole portions is preferably performed after formation of the outermost layer that is the resin insulating layer. Alternatively, regarding the build-up substrate according to the present invention, copper foil with a resin in which the resin composition is semi-cured on the copper foil may be thermocompression bonded at 170° C. to 300° C. to a wiring board provided with the circuits so as to form a roughened surface and to produce a build-up substrate without the step of performing plating treatment.

6. Build-Up Film

A method for obtaining a build-up film from the curable resin composition according to the present invention may be a method in which, for example, a support film is coated with the curable resin composition and, thereafter, drying is performed so as to form a resin composition layer on the support film. When the curable resin composition according to the present invention is used for the build-up film, it is important that the film is softened under the temperature condition (usually 70° C. to 140° C.) of lamination based on a vacuum lamination method and exhibits fluidity (resin flowing) so as to enable the via holes or through holes located in the circuit boards to be filled with the resin at the same time with lamination of the circuit boards. It is preferable that the above-described components be mixed so as to realize such characteristics.

In this regard, the diameter of the through hole in the circuit board is usually 0.1 to 0.5 mm, and the depth is usually 0.1 to 1.2 mm. It is usually preferable that filling with the resin can be performed in this range. Meanwhile, when both surfaces of the circuit board are subjected to lamination, it is desirable that about half the through hole be filled.

A specific method for obtaining a build-up film may be a method in which, after a resin composition is made into a varnish by mixing with an organic solvent, the surface of a support film (Y) is coated with the above-described composition, and the organic solvent is dried by further performing heating, hot air blowing, or the like so as to form a layer (X) of the resin composition.

Regarding the organic solvent used here, ketones, for example, acetone, methyl ethyl ketone, and cyclohexanone, acetic acid esters, for example, ethyl acetate, butyl acetate, cellosolve acetate, propylene glycol monomethyl ether acetate, and carbitol acetate, carbitols, for example, cellosolve and butyl carbitol, aromatic hydrocarbons, for example, toluene and xylene, dimethylformamide, dimethylacetamide, N-methylpyrrolidone, and the like are preferably used, and the organic solvent is preferably used at such a proportion that a non-volatile content becomes 30% by mass to 60% by mass.

Meanwhile, the thickness of the layer (X) of the resulting resin composition has to be usually more than or equal to the thickness of the conductive layer. The thickness of the conductive layer included in the circuit board is usually within the range of 5 to 70 µm and, therefore, the resin composition layer has a thickness of preferably 10 to 100 µm. In this regard, the layer (X) of the resin composition according to the present invention may be protected by a protective film as described later. Protection by the protective film can prevent adhesion of dust and the like to the resin composition layer surface and occurrence of flaws.

Examples of the support film or the protective film include polyolefins, for example, a polyethylene, a polypropylene, and a polyvinyl chloride, polyesters, for example, a polyethylene terephthalate (hereafter may also be referred to as "PET") and a polyethylene naphthalate, a polycarbonate, a polyimide, and, in addition, release paper and metal foil, for example, copper foil and aluminum foil. In this regard, the support film and the protective film may be subjected to mud treatment, corona treatment, and, in addition, release treatment. There is no particular limitation regarding the thickness of the support film, and the thickness is usually 10 to 150 µm, and preferably within the range of 25 to 50 µm. Meanwhile, the thickness of the protective film is preferably 1 to 40 µm.

The support film (Y) is pealed after the circuit board is subjected to lamination or the insulating layer is formed by heat curing. When the support film (Y) is peeled after the resin composition constituting the build-up film is heat-cured, adhesion of dust and the like during the curing step can be prevented. In the case in which peeling is performed after curing, the support film is usually subjected to release treatment in advance.

Meanwhile, a multilayer printed circuit board can be produced from the build-up film obtained as described above. For example, in the case in which the layers (X) of the resin composition are protected by the protective films, these are pealed and, thereafter, the layer (X) of the resin composition is laminated on one surface or both surfaces of the circuit board so as to come into direct contact with the circuit board by, for example, a vacuum lamination method. The method of lamination may be a batch type or continuous type by using a roll. In this regard, as the situation demands, the build-up film and the circuit board may be heated before lamination is performed (preheat). Regarding the conditions of the lamination, the pressure bonding temperature (lamination temperature) is set to be preferably 70° C. to 140° C., the pressure of the pressure bonding is set to be preferably 1 to 11 kgf/cm$^2$ ($9.8 \times 10^4$ to $107.9 \times 10^4$ N/m$^2$), and lamination is performed preferably under reduced pressure at an air pressure of 20 mm Hg (26.7 hPa) or less.

7. Fiber-Reinforced Composite Material

A method for obtaining a fiber-reinforced composite material (sheet like intermediate material in which reinforcing fiber is impregnated with a resin) from the resin composition according to the present invention may be a production method in which a varnish is prepared by homogeneously mixing components constituting the resin composition, a reinforcing base material composed of the reinforcing fiber is impregnated with the varnish and, thereafter, a polymerization reaction is performed.

Specifically, the curing temperature when such a polymerization reaction is performed is preferably within the range of 50° C. to 250° C. In particular, it is preferable that curing be performed at 50° C. to 100° C. so as to produce a tuck-free cured product and, thereafter, treatment under the temperature condition of 120° C. to 200° C. be further performed.

In this regard, the reinforcing fiber may be any one of twisted yarn, untwisted yarn, zero twist yarn, and the like, and untwisted yarn and zero twist yarn are preferable because compatibility between the moldability of a fiber-reinforced plastic member and the mechanical strength is ensured. Further, regarding the form of the reinforcing fiber, fiber directions may be equalized to one direction or a textile may be used. The textile may be freely selected among plain weave, satin weave, and the like in accordance with a serve area or the use. Specific examples include carbon fiber, glass fiber, aramid fiber, boron fiber, alumina fiber, and silicon carbide fiber because of excellent mechanical strength and durability. At least two types of these may be used in combination. Of these, carbon fiber is preferable because of particularly good strength of a molded article. Carbon fiber of various types, for example, polyacrylonitrile type, pitch type, and rayon type, may be used. In particular, polyacrylonitrile type is preferable because high-strength carbon fiber is readily obtained. In this regard, when a fiber-reinforced composite material is produced by impregnating the varnish into a reinforcing base material composed of the reinforcing fiber, the amount of the reinforcing fiber used is preferably an amount corresponding to the volume content of the reinforcing fiber within the range of 40% to 85% in the fiber-reinforced composite material.

8. Fiber-Reinforced Molded Article

A method for obtaining a fiber-reinforced molded article (molded article produced by curing a sheet like member in which the reinforcing fiber is impregnated with a resin) from the resin composition according to the present invention may be a method in which a prepreg is produced by impregnating the reinforcing fiber with the varnish by a hand lay-up method or spray-up method including laying fiber aggregate in a mold and stacking multiple layers of the varnish, a vacuum bag method including using any one of a male die or a female die, stacking base materials composed of the reinforcing fiber while impregnating the base materials with the varnish and performing molding, performing covering with a flexible die that can apply a pressure to a material to be molded, and performing hermetic sealing and vacuum (reduced pressure) molding, an SMC press method including compression molding, in a mold, a reinforcing-fiber-containing varnish made into a sheet in advance, an RTM method including injecting the varnish into a combination die with fiber laid therein, or the like and baking the prepreg in a large autoclave. In this regard, the fiber-reinforced resin molded article obtained as described above is a molded article including the reinforcing fiber and the cured product of the resin composition. Specifically, the amount of the reinforcing fiber in the fiber-reinforced molded article is preferably within the range of 40% by mass to 70% by mass and particularly preferably within the range of 50% by mass to 70% by mass from the viewpoint of the strength.

9. Conductive Paste

A method for obtaining a conductive paste from the resin composition according to the present invention is, for example, a method in which fine conductive particles are dispersed into the curable resin composition. The conductive paste can be made into a circuit connection paste resin composition or an anisotropic conductive adhesive in accordance with the type of fine conductive particles used.

EXAMPLES

Next, the present invention will be specifically described with reference to the examples and the comparative examples. Hereafter "part" or "%" is on a mass basis, unless otherwise specified. In this regard, GPC and $^{13}$C-NMR spectrum were measured under the following conditions.

<GPC Measurement Conditions>
Measurement apparatus: "HLC-8320 GPC" produced by Tosoh Corporation
Column: guard column "HXL-L" produced by Tosoh Corporation
+"TSK-GEL G2000HXL" produced by Tosoh Corporation
+"TSK-GEL G2000HXL" produced by Tosoh Corporation
+"TSK-GEL G3000HXL" produced by Tosoh Corporation
+"TSK-GEL G4000HXL" produced by Tosoh Corporation
Detector: RI (differential refractometer)
Data processing: "GPC workstation EcoSEC-WorkStation" produced by Tosoh Corporation
Measurement condition:
column temperature 40° C.
developing solvent tetrahydrofuran
flow rate 1.0 ml/min
Standard: in conformity with the measurement manual of "GPC workstation EcoSEC-WorkStation" described above, monodisperse polystyrenes, as described below, having known molecular weights were used
(Polystyrene Used)
"A-500" produced by Tosoh Corporation
"A-1000" produced by Tosoh Corporation
"A-2500" produced by Tosoh Corporation
"A-5000" produced by Tosoh Corporation
"F-1" produced by Tosoh Corporation
"F-2" produced by Tosoh Corporation
"F-4" produced by Tosoh Corporation
"F-10" produced by Tosoh Corporation
"F-20" produced by Tosoh Corporation
"F-40" produced by Tosoh Corporation
"F-80" produced by Tosoh Corporation
"F-128" produced by Tosoh Corporation Sample: a tetrahydrofuran solution containing 1.0% by mass of resin solid content was filtrated by a microfilter (50 μl)
<$^{13}$C-NMR Measurement Conditions>
Apparatus: AL-400 produced by JEOL LTD.
Measurement mode: inverse-gated decoupling
Solvent: deuterated chloroform
Pulse angle: 30° pulse
Sample concentration: 30% by weight
Number of acquisitions: 4,000 times Synthesis Example 1

After charging 900 parts by mass (6.0 mol) of p-t-butylphenol and 18 parts by mass of oxalic acid into a flask provided with a thermometer, a dropping funnel, a cooling tube, a fractionating column, and an agitator, agitation was performed while the temperature was increased from room temperature to 98° C. over 45 minutes. Subsequently, 54 parts by mass (0.75 mol) of aqueous solution containing 42% by mass of formalin was dropped over 2 hours. After the dropping was finished, agitation was further performed at 98° C. for 1 hour, and then, temperature was increased to 180° C. over 3 hours. After a reaction was finished, water and unreacted materials that remained in the reaction system were removed under heating and reduced pressure so as to obtain phenol novolak resin (A-1). FIG. 1 shows the $^{13}$C-NMR chart of resulting phenol novolak resin (A-1), and FIG. 2 shows the GPC chart. The hydroxyl equivalent of phenol novolak resin (A-1) was 156 g/eq, the melt viscosity (ICI) at 150° C. was 0.1 dPa·s, the (a)/(b) value was 0.07, and the area ratio of a body with n=0 based on the GPC measurement was 0.8%.

Synthesis Example 2

Phenol resin (A-2) was obtained in the same manner as synthesis example 1 except that 900 parts by mass (6.0 mol) of p-t-butylphenol was changed to 675 parts by mass (4.3 mol) of p-t-butylphenol and 225 parts by mass (1.7 mol) of o-t-butylphenol. The hydroxyl equivalent of resulting phenol novolak resin (A-2) was 156 g/eq, the melt viscosity (ICI) at 150° C. was 0.1 dPa·s, the (a)/(b) value was 0.07, and the area ratio of a body with n=0 based on the GPC measurement was 0.4%.

Synthesis Example 3

Phenol resin (A-3) was obtained in the same manner as synthesis example 1 except that 900 parts by mass (6.0 mol) of p-t-butylphenol was changed to 675 parts by mass (4.3 mol) of p-t-butylphenol and 225 parts by mass (1.1 mol) of 2,4-di-t-butylphenol and the aqueous solution containing 42% by mass of formalin was changed to 343 parts by mass (4.7 mol). FIG. 3 shows the $^{13}$C-NMR chart of resulting phenol resin (A-3), and FIG. 4 shows the GPC chart. The hydroxyl equivalent of phenol novolak resin (A-3) was 166 g/eq, the melt viscosity (ICI) at 150° C. was 0.2 dPa·s, the (a)/(b) value was 0.08, and the area ratio of a body with n=0 based on the GPC measurement was 0.7%.

Comparative Synthesis Example 1

Phenol resin (A'-1) was obtained in the same manner as synthesis example 1 except that the aqueous solution containing 42% by mass of formalin was changed to 369 parts by mass (5.1 mol). FIG. 5 shows the $^{13}$C-NMR chart of resulting phenol novolak resin (A'-1), and FIG. 6 shows the GPC chart. The hydroxyl equivalent of phenol novolak resin (A'-1) was 157 g/eq, the (a)/(b) value was 0.315, and the area of a body with n=0 was 0.6%.

Comparative Synthesis Example 2

After charging 100 parts by mass of phenol novolak resin (A'-1) and 4 parts by mass of p-t-butylphenol into a flask provided with a thermometer, a dropping funnel, a cooling tube, a fractionating column, and an agitator, mixing was performed at 150° C. for 3 hours so as to obtain phenol novolak resin (A'-2). FIG. 7 shows the $^{13}$C-NMR chart of resulting phenol novolak resin (A'-2), and FIG. 8 shows the GPC chart. The hydroxyl equivalent of phenol novolak resin (A'-2) was 157 g/eq, the [a]/[b] value was 0.298, and the area of a body with n=0 was 4.4%.

Comparative Synthesis Example 3

Phenol novolak resin (A'-3) was obtained in the same manner as synthesis example 1 except that 900 parts by mass (6.0 mol) of p-t-butylphenol was changed to 675 parts by mass (4.3 mol) of p-t-butylphenol and 225 parts by mass (1.1 mol) of p-t-octylphenol, and the aqueous solution containing 42% by mass of formalin was changed to 343 parts by mass (4.7 mol). FIG. 9 shows the $^{13}$C-NMR chart of resulting phenol novolak resin (A'-3), and FIG. 10 shows the GPC chart. The hydroxyl equivalent of phenol novolak resin (A'-3) was 168 g/eq, the melt viscosity (ICI) at 150° C. was 1.9 dPa·s, the (a)/(b) value was 0.37, and the area ratio of a body with n=0 based on the GPC measurement was 5.1%.

Target curable resin compositions were prepared by mixing the following compounds so as to have the compositions shown in Tables 1 and 2 and, thereafter, performing melt kneading at a temperature of 90° C. for 5 minutes by using a two-roll mill. The abbreviations in Tables 1 and 2 represents the following compounds.

Resin A-1: phenol novolak resin obtained in synthesis example 1
Resin A-2: phenol novolak resin obtained in synthesis example 2
Resin A-3: phenol novolak resin obtained in synthesis example 3
Resin A'-1: phenol novolak resin obtained in comparative synthesis example 1
Resin A'-2: phenol novolak resin obtained in comparative synthesis example 2
Resin A'-3: phenol novolak resin obtained in comparative synthesis example 3
Resin A'-4: 2,2'-methylenebis(4-tertiary butylphenol) (hydroxyl equivalent of 156 g/eq, (a)/(b) value of 0, and area of a body with n=0 of 0%)
Epoxy resin: cresol novolak type epoxy resin "N-655-EXP-S", equivalent: 201 g/eq (produced by DIC Corporation)
TPP: triphenylphosphine
Fused silica: spherical silica "FB-560" produced by DENKI KAGAKU KOGYO K.K.
Silane coupling agent: γ-glycidoxytriethoxysilane "KBM-403" produced by Shin-Etsu Chemical Co., Ltd.
Carnauba wax: "PEARL WAX No. 1-P" produced by DENKI KAGAKU KOGYO K.K.

<Measurement of Fluidity>

The curable resin composition obtained as described above was injected into a test mold, and the spiral flow value was measured under the conditions of 175° C., 70 kg/cm$^2$, and 120 sec. The results are shown in Tables 1 and 2.

Subsequently, the curable resin composition obtained as described above was pulverized, the resulting material was molded into a disc-like shape of diameter 50 mm×3 (t) mm at a pressure of 70 kg/cm$^2$ and a temperature of 175° C. for a time of 180 sec by a transfer molding machine, and curing was further performed at 180° C. for 5 hours.

<Measurement of Glass Transition Temperature and Modulus of Elasticity>

The cured product having a thickness of 0.8 mm of the molded material produced as described above was cut into a size of 5 mm wide and 54 mm long, and this was designated as test piece 1. Regarding test piece 1, a viscoelasticity measuring apparatus (DMA: solid rheometer "RSA II" produced by Rheometric Scientific Inc., rectangular tension method: frequency of 1 Hz, temperature increasing rate of 3° C./min) was used, and the temperature at which a change in the modulus of elasticity was at maximum (change in tan δ was at maximum) was measured as the glass transition temperature, the storage modulus at 40° C. was measured as the modulus of elasticity at normal temperature, and the storage modulus at 260° C. was measured as the modulus of elasticity at high temperature.

<Measurement of Mold Shrinkage>

A transfer molding machine (KTS-15-1.5C produced by KOHTAKI PRECISION MACHINE CO., LTD.) was used, and a resin composition was injection molded under the conditions of a mold temperature of 150° C., a molding pressure of 9.8 MPa, and a curing time of 600 sec so as to produce a test piece of 110 mm long, 12.7 mm wide, and 1.6 mm thick. Thereafter, the test piece was post-cured at 175° C. for 5 hours, the inner diameter dimension of the mold cavity and the outer diameter dimension of the test piece at room temperature (25° C.) were measured, and the shrinkage was calculated on the basis of the following formula.

shrinkage (%)={(inner diameter dimension of mold)−(dimension in longitudinal direction of cured product at 25° C.)}/(inner diameter dimension of mold cavity at 175° C.)×100(%)

The results are shown in Tables 1 and 2.

TABLE 1

|  |  | Example 1 | Example 2 | Example 3 | Example 4 | Example 5 | Example 6 |
|---|---|---|---|---|---|---|---|
| Phenol resin | A-1 | 211 | 211 |  |  |  |  |
|  | A-2 |  |  | 211 | 211 |  |  |
|  | A-3 |  |  |  |  | 218 | 218 |
|  | A'-1 |  |  |  |  |  |  |
|  | A'-2 |  |  |  |  |  |  |
|  | A'-3 |  |  |  |  |  |  |
|  | A'-4 |  |  |  |  |  |  |
| Epoxy resin | N-655-EXP-5 | 272 | 272 | 272 | 272 | 265 | 265 |
| TPP |  | 5 | 5 | 5 | 5 | 5 | 5 |
| Fused silica |  | 500 | 0 | 500 | 0 | 500 | 0 |
| Silane coupling agent |  | 7 | 0 | 7 | 0 | 7 | 0 |
| Carnauba wax |  | 5 | 0 | 5 | 0 | 5 | 0 |
| Measurement result |  |  |  |  |  |  |  |
| Spiral flow (cm) |  | 111 | — | 115 | — | 121 | — |
| Glass transition temperature (° C.) |  | — | 122 | — | 121 | — | 125 |

TABLE 1-continued

|  | Example 1 | Example 2 | Example 3 | Example 4 | Example 5 | Example 6 |
| --- | --- | --- | --- | --- | --- | --- |
| Modulus of elasticity at normal temperature (MPa) | — | 2600 | — | 2500 | — | 2200 |
| Modulus of elasticity at high temperature (MPa) | — | 5 | — | 4 | — | 3 |
| Mold shrinkage (%) | 0.7 | — | 0.8 | — | 0.6 | — |

TABLE 2

|  |  | Comparative example 1 | Comparative example 2 | Comparative example 3 | Comparative example 4 | Comparative example 5 | Comparative example 6 | Comparative example 7 | Comparative example 8 |
| --- | --- | --- | --- | --- | --- | --- | --- | --- | --- |
| Phenol resin | A-1 |  |  |  |  |  |  |  |  |
|  | A-2 |  |  |  |  |  |  |  |  |
|  | A-3 |  |  |  |  |  |  |  |  |
|  | A'-1 | 212 | 212 |  |  |  |  |  |  |
|  | A'-2 |  |  | 212 | 212 |  |  |  |  |
|  | A'-3 |  |  |  |  | 220 | 220 |  |  |
|  | A'-4 |  |  |  |  |  |  | 211 | 211 |
| Epoxy resin | N-655-EXP-5 | 271 | 271 | 271 | 271 | 263 | 263 | 272 | 272 |
| TPP |  | 5 | 5 | 5 | 5 | 5 | 5 | 5 | 5 |
| Fused silica |  | 500 | 0 | 500 | 0 | 500 | 0 | 500 | 500 |
| Silane coupling agent |  | 7 | 0 | 7 | 0 | 7 | 0 | 7 | 7 |
| Carnauba wax |  | 5 | 0 | 5 | 0 | 5 | 0 | 5 | 5 |
|  |  |  |  |  | Measurement result |  |  |  |  |
| Spiral flow (cm) |  | 91 | — | 99 | — | 85 | — | 110 | — |
| Glass transition temperature (° C.) |  | — | 122 | — | 119 | — | 111 | — | 117 |
| Modulus of elasticity at normal temperature (MPa) |  | — | 2600 | — | 2500 | — | 2600 | — | 2900 |
| Modulus of elasticity at high temperature (MPa) |  | — | 8 | — | 6 | — | 8 | — | 5 |
| Mold shrinkage (%) |  | 1.1 | — | 1.2 | — | 1.0 | — | 1.0 | — |

The invention claimed is:

1. A phenol novolak resin that is an alkyl phenol novolak resin produced by bonding alkyl phenol (I), in which an alkyl group having a carbon number of 4 to 8 is included as a substituent on an aromatic ring, to each other with a methylene group interposed therebetween, the number of the alkyl group having 4 to 8 carbon atoms in the alkylphenol (I) is 1 to 3, the substitution position of the alkyl group is the ortho position or the para position of the hydroxyl group, and a number of aromatic units ranging from 1 to 6,
wherein the ratio (a)/(b) of a value (a) of integration from 146 to 148 ppm to a value (b) of integration from 146 to 153 ppm based on the $^{13}$C-NMR measurement is within the range of 0.05 to 0.30, and
the area ratio of alkyl phenol (I) based on GPC measurement is within the range of 0.01% to 3.0%.

2. The phenol novolak resin according to claim 1, wherein the ICI viscosity of the phenol novolak resin at 150° C. is 0.01 to 3.0 dPa·s.

3. The phenol novolak resin according to claim 1, wherein the area ratio of the alkyl phenol (I) based on GPC measurement of the phenol novolak resin is within the range of 0.4% to 3.0%.

4. The phenol novolak resin according to claim 1, an average number of hydroxyl groups in each molecular chain in the phenol novolak resin is in the range of 1.01 to 3.

5. A curable resin composition comprising, the phenol novolak resin according to claim 1 and a resin having a functional group that reacts with a hydroxy group.

6. The curable resin composition according to claim 5, wherein the resin having a functional group that reacts with a hydroxy group is an epoxy resin.

7. The curable resin composition according to claim 6, further comprising an epoxy resin curing agent other than the phenol novolak resin.

8. A cured product of the curable resin composition according to claim 5.

9. A semiconductor sealing material comprising the curable resin composition according to claim 5 and an inorganic filler.

10. A semiconductor device that is a cured product of the semiconductor sealing material according to claim 9.

11. A prepreg that is a semi-cured product of an impregnation base material including the curable resin composition according to claim 5 and a reinforcing base material.

12. A circuit board comprising a tabularly shaped product of the curable resin composition according to claim 5 and copper foil.

13. A build-up film comprising a cured product of the curable resin composition according to claim 5 and a base material film.

14. A fiber-reinforced composite material comprising the curable resin composition according to claim 5 and reinforcing fiber.

15. A fiber-reinforced molded article that is a cured product of the fiber-reinforced composite material according to claim 14.

16. The phenol novolak resin according to claim 1, wherein alkyl phenol (I) is t-butylphenol and/or di-t-butylphenol.

17. The phenol novolak resin according to claim 16, wherein the ICI viscosity of the phenol novolak resin at 150° C. is 0.01 to 3.0 dPa·s.

18. The phenol novolak resin according to claim 16, wherein the area ratio of the alkyl phenol (I) based on GPC measurement of the phenol novolak resin is within the range of 0.4% to 3.0%.

19. The phenol novolak resin according to claim 16, an average number of hydroxyl groups in each molecular chain in the phenol novolak resin is in the range of 1.01 to 3.

20. A curable resin composition comprising, the phenol novolak resin according to claim 16 and a resin having a functional group that reacts with a hydroxy group.

* * * * *